(12) United States Patent
Shinoda

(10) Patent No.: US 6,894,764 B2
(45) Date of Patent: May 17, 2005

(54) ILLUMINATION OPTICAL SYSTEM, EXPOSURE APPARATUS HAVING THE SAME, AND DEVICE FABRICATING METHOD

(75) Inventor: Kenichiro Shinoda, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/421,426

(22) Filed: Apr. 23, 2003

(65) Prior Publication Data

US 2003/0197847 A1 Oct. 23, 2003

(30) Foreign Application Priority Data

Apr. 23, 2002 (JP) .................................. 2002-121378

(51) Int. Cl.$^7$ ............................................. G03B 27/54
(52) U.S. Cl. ............................. 355/67; 355/68; 355/69; 355/71; 355/53
(58) Field of Search .............................. 355/53, 67–69, 355/71, 77; 250/548; 430/5, 311

(56) References Cited

U.S. PATENT DOCUMENTS

| | | | | |
|---|---|---|---|---|
| 5,345,292 | A | | 9/1994 | Shiozawa et al. ............. 355/67 |
| 5,357,311 | A | * | 10/1994 | Shiraishi ...................... 355/53 |
| 5,357,312 | A | | 10/1994 | Tounai ........................ 355/67 |
| 5,452,054 | A | | 9/1995 | Dewa et al. .................. 355/67 |
| 5,675,401 | A | | 10/1997 | Wangler et al. ............... 355/67 |
| 6,211,944 | B1 | | 4/2001 | Shiraishi ...................... 355/53 |
| 6,233,041 | B1 | | 5/2001 | Shiraishi ...................... 355/53 |
| 6,252,647 | B1 | | 6/2001 | Shiraishi ...................... 355/53 |
| 6,259,512 | B1 | | 7/2001 | Mizouchi ..................... 355/67 |
| 2002/0177048 | A1 | * | 11/2002 | Saitoh et al. ................. 355/18 |

* cited by examiner

*Primary Examiner*—D. Rutledge
(74) *Attorney, Agent, or Firm*—Morgan & Finnegan LLP

(57) ABSTRACT

An illumination optical system for illuminating a reticle using light from a light source includes an illumination-light generating mechanism for generating a light amount distribution on a plane that has a substantially Fourier conversion relationship with the reticle while making variable a ratio of a light amount between a first area and a second area different from the first area, the first and second areas being on the plane.

20 Claims, 17 Drawing Sheets

| RESOLUTION PATTERN | EFFECTIVE LIGHT SOURCE SHAPE |
|---|---|
|  |  |

ILLUMINATION OPTICAL SYSTEM, EXPOSURE APPARATUS HAVING THE SAME, AND DEVICE FABRICATING METHOD

This application claims the right of priority under 35 U.S.C. §119 based on Japanese Patent Application No. 2002-121378, filed on Apr. 23, 2002, which is hereby incorporated by reference herein in its entirety as if fully set forth herein.

BACKGROUND OF THE INVENTION

The present invention relates generally to illumination optical systems, and more particularly to an illumination apparatus in an illumination apparatus and an exposure apparatus used to expose objects such as single crystal plates for semiconductor wafers, glass plates for liquid crystal displays (LCD), and the like. The present invention is suitable, for example, for an illumination apparatus that scans and exposes an object that includes a contact-hole line pattern or a mixture of isolated contact hole and contact-hole line in a photolithography process.

Along with recent demands on smaller and thinner profile electronic devices, fine semiconductor devices to be mounted onto these electronic devices have been increasingly demanded. For example, a design rule have attempted to form a circuit pattern of 100 nm or less on a mass production line, and which will expectedly shift to 80 nm or less. The mainstream photolithography technology has conventionally used a projection exposure apparatus that projects and transfers a pattern on a mask (reticle) onto a wafer.

Rayleigh equation provides the resolution R of the projection exposure apparatus using a light-source wavelength λ and a numerical aperture (NA) of the projection optical system as follows:

$$R = k_1 \times \frac{\lambda}{NA} \quad (1)$$

A focus range that may maintain certain imaging performance is called a depth of focus (DOF), which is defined in the following equation:

$$DOF = k_2 \times \frac{\lambda}{NA^2} \quad (2)$$

Since small DOF makes focusing difficult and thus requires strict flatness and focus accuracy, larger DOF is preferable.

A mask pattern includes an adjacent and periodic line and space (L & S) pattern, an adjacent and periodic contact-hole line that arranges holes at an approximately hole interval, an isolated contact hole that does not have a pair and thus is isolated, other isolated patterns, etc. A pattern transfer with high resolution requires a selection of optimal illumination condition in accordance with pattern types.

The recent semiconductor industry has shifted its production to a highly value-added system chip that mixes a wide variety of patterns. However the prior art cannot finish exposure such a contact-hole pattern at one time with high resolution, as blends a contact-hole line and an isolated contact hole.

Various methods have been proposed to increase DOF by improving the resolution limit only for a contact-hole line and a longitudinally and laterally periodic wire pattern. These methods include, for example, a double exposure or multi-exposure method that uses two masks to separately expose different types of patterns, an exposure method that uses one mask and special illumination conditions, and a method that provides a mask with various auxiliary patterns to improve the resolving power for a desired pattern.

The above methods commonly require an illumination optical system that serves to freely vary illumination conditions, specifically an effective light-source distribution of the illumination optical system, whenever a size and arrangement of a mask pattern changes according to processes. Disadvantageously, the conventional illumination optical system cannot provide this function, or obtain a high resolution with an optimal illumination condition.

Prior art discloses a switch mechanism from a normal circle effective light source to an annular effective light source, and a switch mechanism to a quadrupole effective light source. However, a change of an effective light source even in the same type is necessary to improve the resolution for future fine patterns.

BRIEF SUMMARY OF THE INVENTION

Accordingly, it is an exemplified object of the present invention to provide an illumination optical system that obtains a desired effective light source according to changes of a pattern, and partially changes the effective light source.

An illumination optical system as one aspect of the present invention for illuminating a reticle using light from a light source includes an illumination-light generating mechanism for generating a light amount distribution on a plane that has a substantially Fourier conversion relationship with the reticle while making variable a ratio of a light amount between a first area and a second area different from the first area, the first and second areas being on the plane. Light from the first area may substantially illuminate the reticle to resolve a desired pattern on the reticle, and light from the second area may substantially illuminate the reticle to restrain an auxiliary pattern on the reticle from resolving. The illumination-light generating mechanism may include a prism or diffraction optical element.

An illumination optical system of another aspect of the present invention for illuminating an object surface using light from a light source includes an illumination-light generating mechanism for generating a light amount distribution on a plane that has a substantially Fourier conversion relationship with the object surface, wherein the illumination-light generating mechanism includes a first light transmission element that is arranged at a side of the light source and forms a first light division part for diving the light on a surface of the first light transmission element, and a second light transmission element that is arranged at a side of the object surface and forms a second light division part for diving the light on a surface of the second light transmission element, and wherein the first and second light division parts have non-parallel sectional shapes that include an optical axis.

The first and second light transmission elements may move in an optical-axis direction relative to each other, wherein one of the first and second light transmission elements may have a polyhedral incidence or exit end, and the other of the first and second light transmission elements may have a cone incidence or exit surface. The first light transmission element may have a concave polyhedral or cone incidence end and a plane exit end, while the second light transmission element may have a convex plane incidence end and a polyhedral or cone exit end.

The first light transmission element may have a convex plane incidence end and a polyhedral or cone exit end, while the second light transmission element may have a concave polyhedral or cone incidence end and a plane exit end. The polyhedral end of the first and/or second light transmission elements has a pyramid shape.

An illumination optical system of still another aspect of the present invention for illuminating an object surface using light from a light source includes a prism for generating a light amount distribution on a plane that has a substantially Fourier conversion relationship with the object surface, wherein the prism having an incidence surface has a polygonal pyramid shape, and a cone exit surface.

An illumination optical system of still another aspect of-the present invention for illuminating an object surface using light from a light source includes an illumination-light generating mechanism for generating a light amount distribution on a plane that has a substantially Fourier conversion relationship with the object surface, wherein the illumination-light generating mechanism includes a first prism that receives the light from the light source, and a second prism that receives light from the first prism, and wherein one of the first and second prisms has a polyhedral incidence or exit end, and the other of the first and second prisms has a cone incidence or exit surface. At least one of the first and second prisms may be adapted to be movable in an optical-axis direction. At least one of the first and second prisms may be rotatable around an optical axis.

An exposure method of another aspect of the present invention comprising the step of illuminating a reticle using the above illumination optical system with light from a light source, and wherein light from the first area substantially contributes to a resolution of a desired pattern on the reticle, and light from the second area substantially contributes to a restraint of an auxiliary pattern from resolving.

A device fabricating method of still another aspect of the present invention includes the steps of exposing an object using the above exposure apparatus, and performing a predetermined process for the exposed object. Claims for a device fabricating method that performs operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
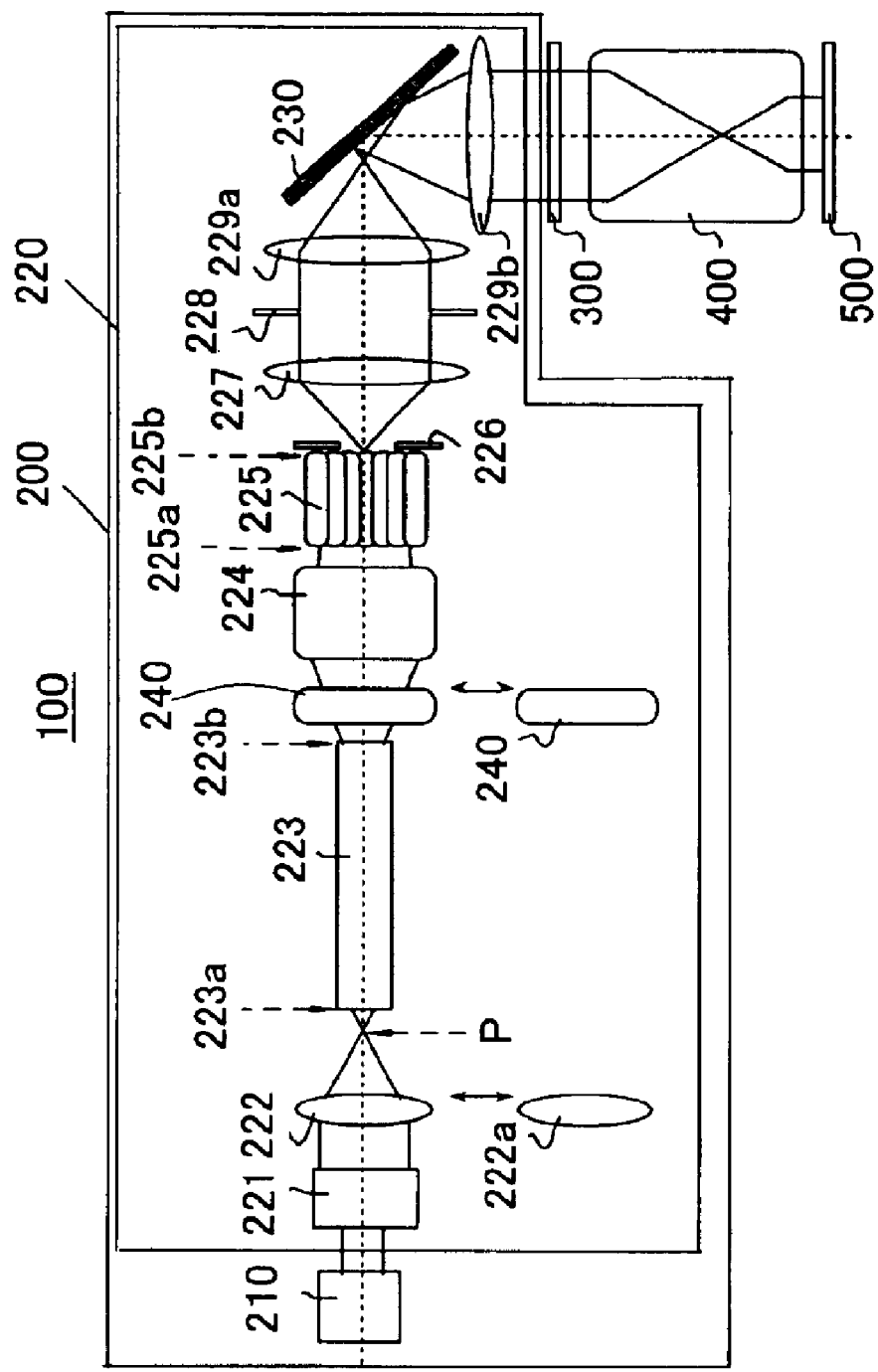
FIG. 1 is a schematic sectional view of an exposure apparatus of one embodiment according to the present invention.

Referring now to the accompanying drawings, a description will be now given of an exposure apparatus 1 according to the present invention. The present invention is not limited to these embodiments and each element is replaceable-within a scope that achieves the objects of the present invention. The same element in each figure is designated by the same reference numeral, and a description will be omitted.

FIG. 1 is a schematic structural view of an exposure apparatus 100 of one embodiment according to the present invention. As best shown in FIG. 1, the exposure apparatus 100 includes an illumination apparatus 200, a mask 300, a projection optical system 400, and a plate 500.

The exposure apparatus 100 is a projection exposure apparatus that exposes onto the plate 500 a circuit pattern created on the mask 300, for example, in a step-and-repeat or step-and-scan manner. This projection exposure apparatus is suitable for a lithography process of a submicron, quarter-micron or less, and thus a description will be given of a step-and-scan type exposure apparatus (also called as a "scanner") as an example in this embodiment. Here, the "step-and-repeat manner" is one mode of exposure method that moves a wafer stepwise to an exposure area for the next shot every shot of cell projection onto the wafer. The "step-and-scan manner," is another mode of exposure method that exposes a mask pattern onto a wafer by continuously scanning the wafer relative to the mask, and by moving, after a shot of exposure, the wafer stepwise to the next exposure area to be shot.

The illumination apparatus 200 illuminates the mask 300 that forms a circuit pattern to be transferred, and includes a light source section 210 and an illumination optical system 220.

The light source section 210 employs, for example, laser as a light source. Laser may use ArF excimer laser with a wavelength of approximately 193 nm, KrF excimer laser with a wavelength of approximately 248 nm, $F_2$ excimer laser with a wavelength of approximately 157 nm, etc. A type of laser is not limited to excimer laser, and the number of laser units is not limited. A light source applicable to the light source section 210 is not limited to the laser, but may use one or more lamps such as a mercury lamp, xenon lamp, etc.

The illumination optical system 220 is an optical system that uses light from the light source 210 to illuminates the mask 300 as an object surface, which forms a desired pattern, and includes a light shaping optical system 221, a condenser optical system 222, an optical pipe (light mixture means) 223, a condenser zoom lens 224, a fly-eye lens 225, a stop member 226, an illumination lens 227, a field stop 228, imaging lenses 229a and 229b, a deflection mirror 230, an illumination-light generating mechanism 240 in the instant embodiment.

Light emitted from the light source 210 is converted into a desired beam shape and condensed by the condenser optical system 222 near an incident surface 223a of the optical pipe 223. The condenser optical system 222 is adapted to be exchangeable with a condenser optical system 222a that has a different exit angle, and maintain a proper angle of the beam incident upon the fly-eye lens 225 even when the condenser zoom lens 224 in the subsequent stage zooms.

When the optical pipe 223 is made of a glass rod, the condensing point P of the condenser optical system 222 or 222a defocuses from the incidence surface 223a of the optical pipe 223 toward the light source section 210 side in order to enhance the durability of the glass rod.

The condenser zoom lens 224 condenses the light from the optical pipe 223 at the incidence surface 225a of the fly-eye lens 225 as multi-beam generating means.

The condenser zoom lens 224 images an exit surface 223b of the optical pipe 223 at a predetermined magnification on the incidence surface 225a of the fly-eye lens 225, and the exit surface 223b is approximately conjugate with the incidence surface 225a. When the condenser zoom lens 224 is made of a zoom lens that may adjust a beam area incident onto the fly-eye lens 225 and form plural illumination conditions.

A vicinity of the exit surface 225b of the fly-eye lens 225 serves as a secondary light source or effective light source, and the stop member 226 is arranged to shield unnecessary light and form the desired effective light source.

The illumination lens 227 superimposes the light from the secondary light source formed near the exit surface 225b of the fly-eye lens 225 onto the field stop 228. The field stop 228 includes plural mobile light-shielding plates, forms an arbitrary opening shape, and defines an illumination area on the mask 300 as the surface to be illuminated.

The imaging lenses 229a and 229b project the opening shape of the field stop 228 through the deflection mirror 230 onto the mask 300 as the surface to be illuminated.

The illumination-light generating means 240 includes an element for converting light from the optical pipe 223 into an annular or quadrupole shape according to illumination conditions including annular illumination, quadrupole illumination, etc.

Figure 2:
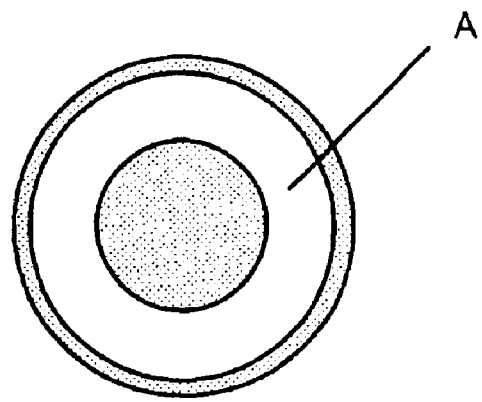
FIG. 2 is a schematic view showing an annular effective light-source distribution.
Figure 3:
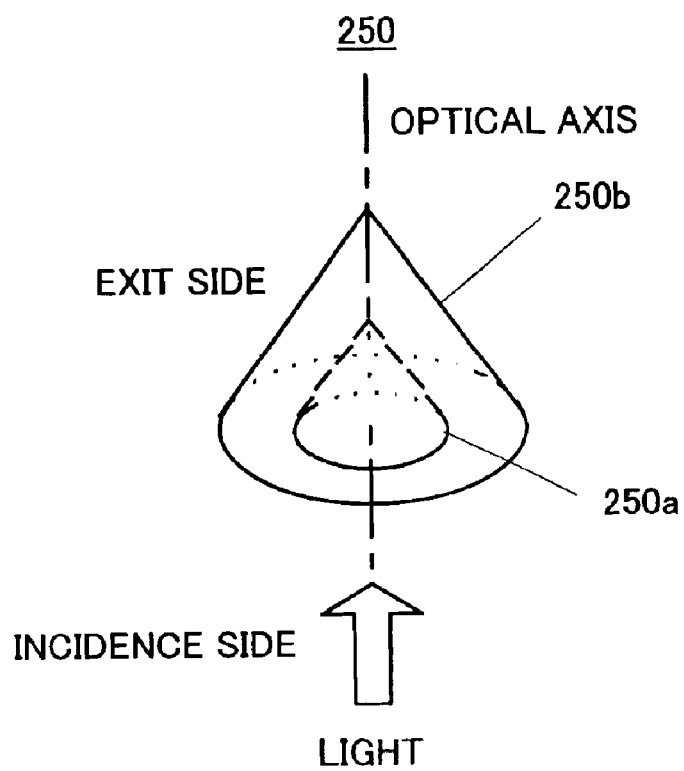
FIG. 3 is a schematic view showing a prism for forming the effective light-source distribution shown in FIG. 2.

A detailed description will be given of the illumination-light generating means 240. In forming an effective light-source distribution including an annular light-emitting part "A" that has been conventionally well known, as shown in FIG. 2, the illumination-light generating means 240 includes a prism 250 provided with a concave cone surface or plane 250a at an incidence side or on the incidence surface, and a concave cone surface 250 at an exit side or on the exit surface. FIG. 2 is a schematic view showing an annular effective light-source distribution, and FIG. 3 is a schematic view of the prism 250 for forming the effective light-source distribution.

Figure 4:
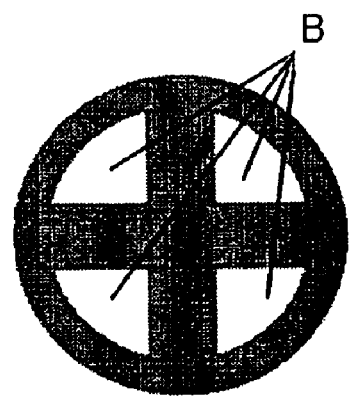
FIG. 4 is a schematic view showing a quadrupole effective light-source distribution.
Figure 5:
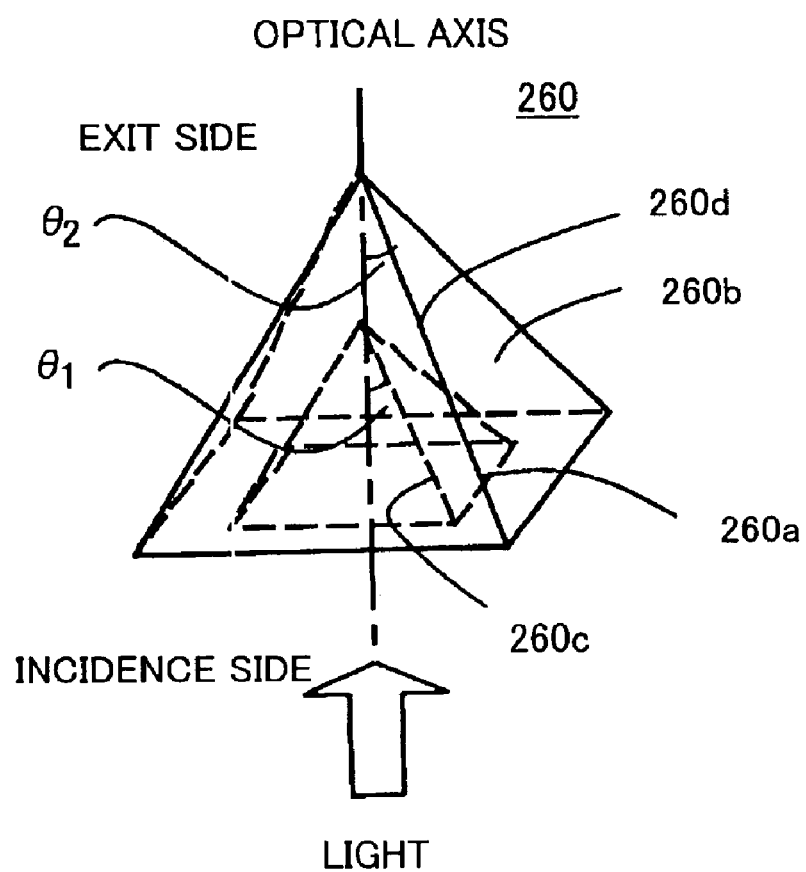
FIG. 5 is a schematic view showing a prism for forming the effective light-source distribution shown in FIG. 4.

In order to form a quadrupole effective light-source distribution having the quadrupole light-emitting part "B", as shown in FIG. 4, the illumination-light generating means 240 includes a prism 260 provided, as shown in FIG. 5, with a concave pyramid surface or plane 260a at the incidence side or on the incident surface and a concave pyramid surface 260b at the exit side or on the exit surface. The edge lines 260c and 260d of the pyramid on incidence and exit surfaces form angles $\theta_1$ and $\theta_2$ with the optical axis, and these angles may be the same or different in order to improve the illumination efficiency or change the quadrupole light-emitting areas or part B in FIG. 4. This is true to the cone prism 250 in FIG. 3. FIG. 4 is a schematic view of the quadrupole effective light-source distribution. FIG. 5 is a schematic view of the prism 260 for forming the effective light-source distribution shown in FIG. 4. The vertex of the prism 260 may be flat by a predetermined amount to form a quintpole effective light-source distribution having a partial effective light source around four partial effective light sources.

Figure 6:
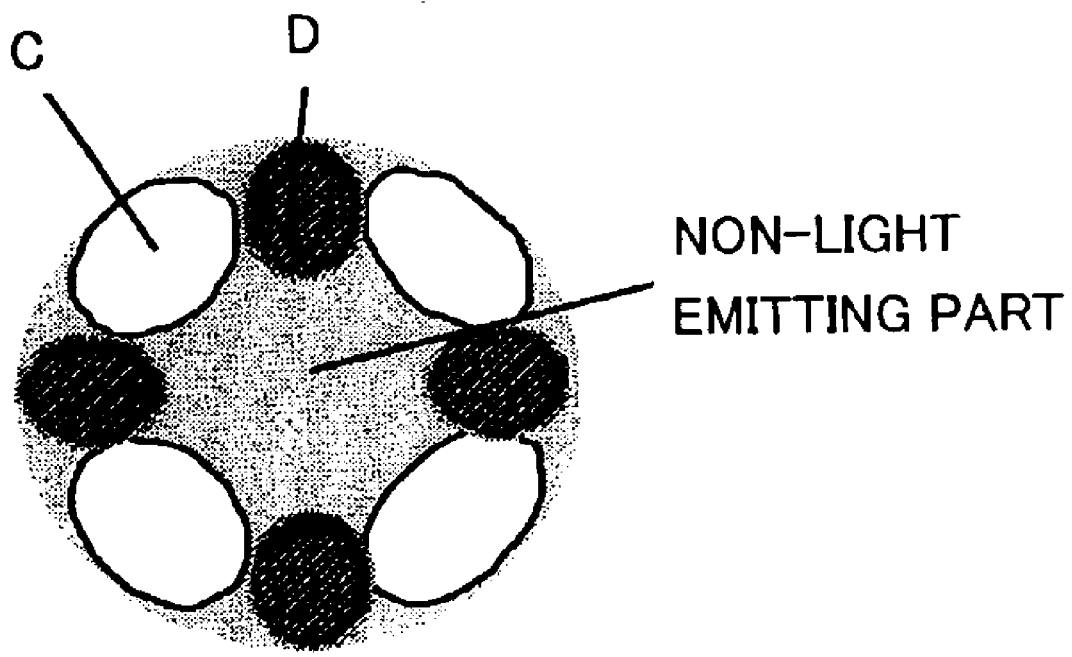
FIG. 6 is a schematic view showing an octpole effective light-source distribution.
Figure 7:
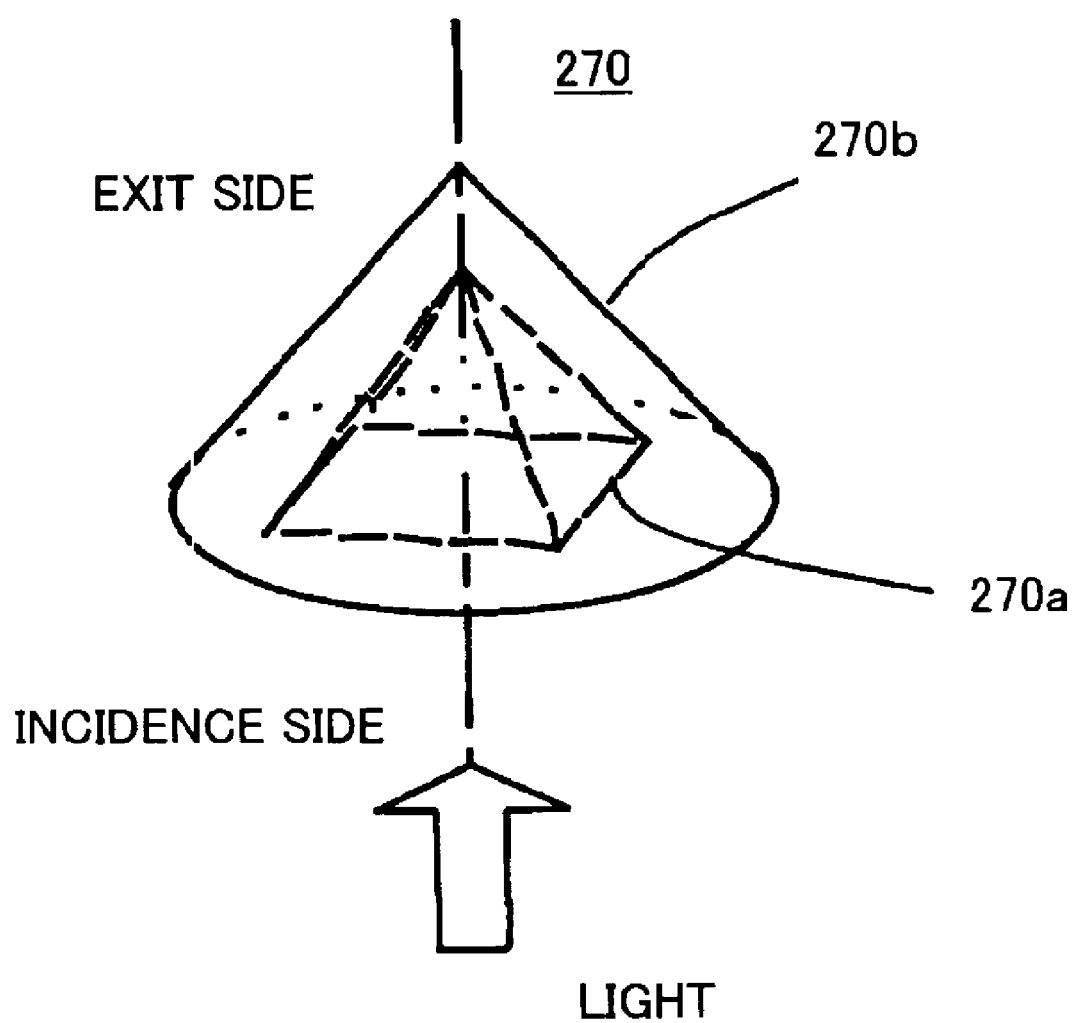
FIG. 7 is a schematic view showing a prism for forming the effective light-source distribution shown in FIG. 6.

In order to form an effective light-source distribution including a first illumination area "C" and a second illumination area "D" as shown in FIG. 6, the illumination-light generating means 240 may include the prism 270 provided, as shown in FIG. 7, with a concave pyramid surface or plane 270a at the incidence side or on the incident surface and a concave cone surface 270b at the exit side or on the exit surface. Thus, a combination of a polyhedral surface for dividing light and a cone shape for properly superimposing the divided beams would form an effective light-source distribution shown in FIG. 6 that has conventionally been hard to be produced.

When the desired and auxiliary patterns are illuminated by the illumination optical system that forms the first and second illumination areas C and D, the resolution limit of the contact-hole line and longitudinally and laterally repetitive wire pattern extends and DOF may increase. A detailed description thereof will be discussed below.

Figure 15:
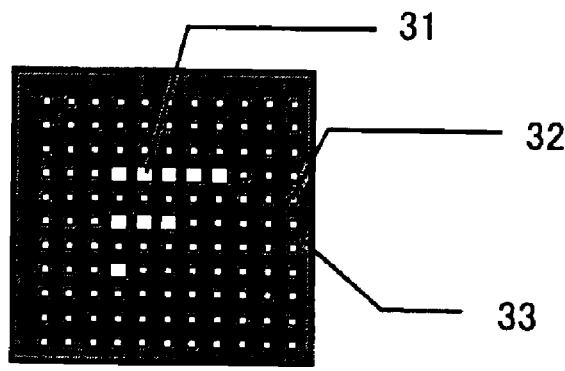
FIG. 15 is a schematic view of a binary mask.

The mask 300 shown in FIG. 1 uses a mask 300a that arranges an auxiliary or dummy pattern around a desired contact-hole pattern. Here, FIG. 15 is a schematic view of a binary mask that forms the desired contact-hole pattern and the auxiliary pattern. The mask in FIG. 15 has the desired contact-hole pattern 31 and auxiliary pattern 32 as light transmitting parts, and a light shielding part 33, where each light transmitting part has the same phase. The contact-hole pattern 31 and auxiliary pattern 32 form two-dimensional contact-hole lines that are lined up with a pitch Po=2P in the longitudinal and lateral directions where a hole diameter is P.

The desired contact-hole pattern may be exposed on the plate 500 with good resolving power by illuminating the mask 300a with crossed oblique incidence illumination for resolving the contact hole and other illumination for restraining a dummy resolution caused by the crossed oblique incidence illumination i.e., preventing the exposure dose corresponding to the dummy resolution pattern (with small exposure dose) and enhancing the exposure dose of the desired contact-hole pattern (with large exposure dose). A detailed description will be given of the illumination.

Figure 16:
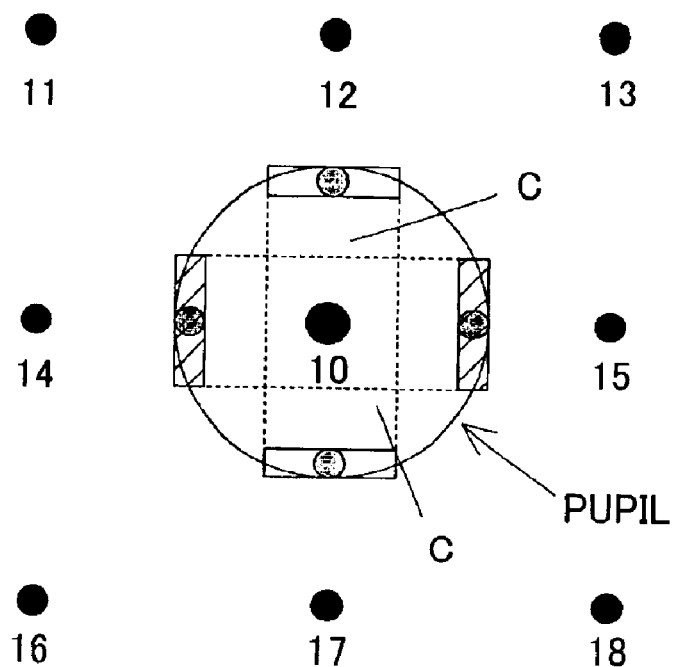
FIG. 16 is a typical view showing positions of diffracted beams on a pupil plane for small σ illumination onto the binary mask shown in FIG. 15 and, positions to which the diffracted beams have moved for oblique incidence illumination.

In case of small σ illumination using the mask 300a in FIG. 15, a diffracted beam, except the 0-th order diffracted beam, deviates from the pupil plane in the projection optical system 400 when a pitch between contact holes is small. As shown in FIG. 16, the 0-th order diffracted beam 10 occurs and diffracted light of other orders are arranged like diffracted beams 11–18 on the pupil plane. No pattern is formed in this condition. Here, FIG. 16 is a typical view showing a position of a diffracted beam on a pupil plane in the projection optical system 400 for small σ illumination onto the mask 300a shown in FIG. 15 and, positions to which diffracted beams move for oblique incidence illumination.

Figure 17:
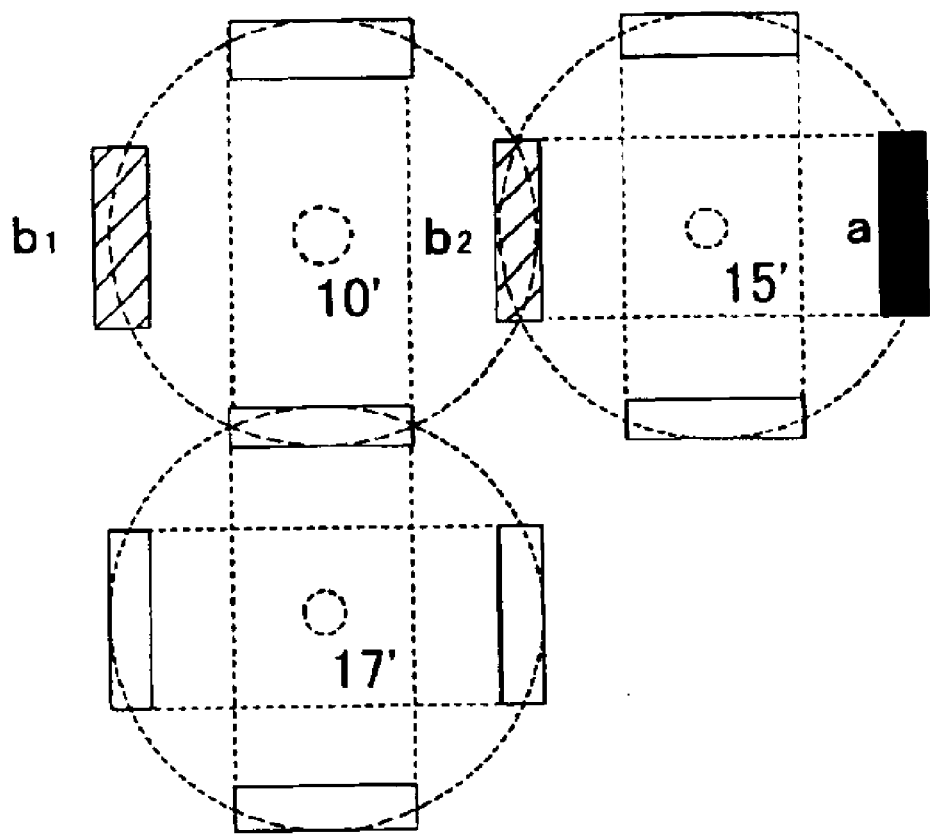
FIG. 17 is a typical view for explaining an effective light-source distribution.
Figure 18:
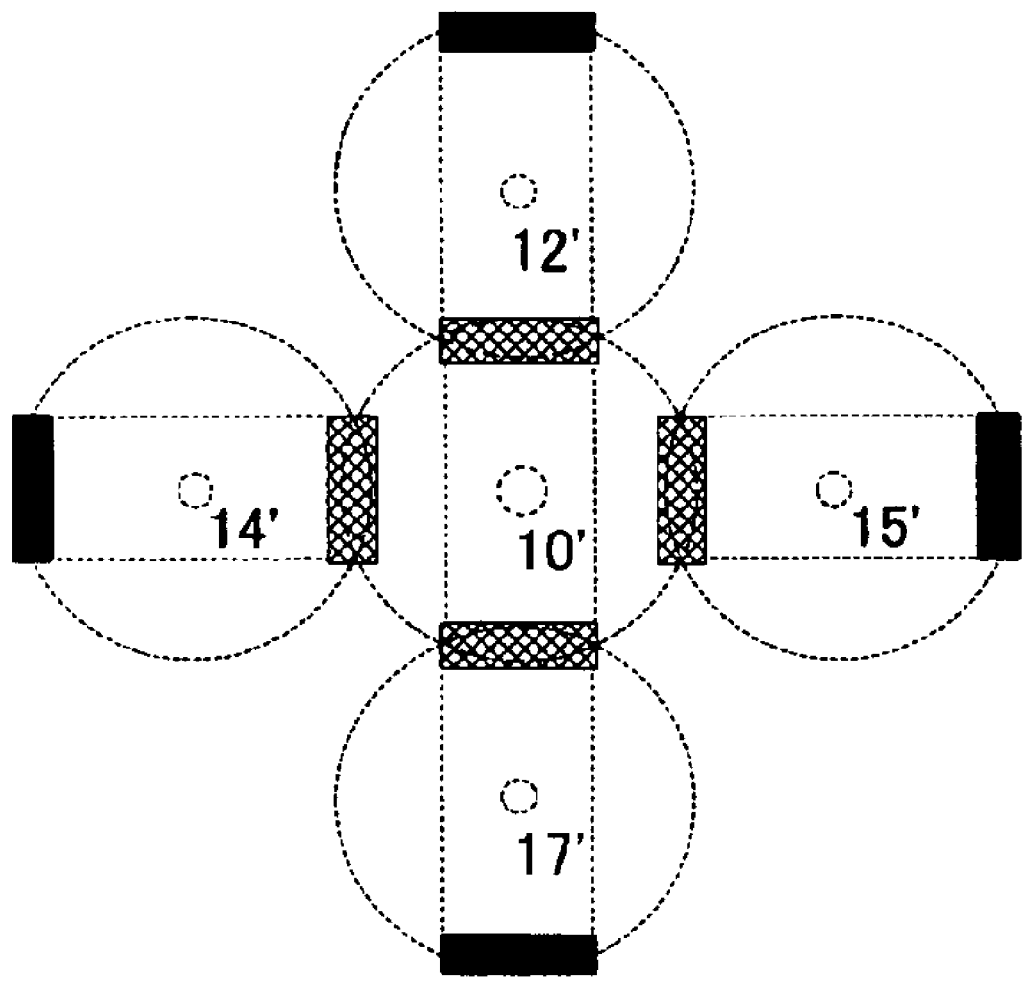
FIG. 18 is a typical view for explaining an effective light-source distribution.
Figure 19A:
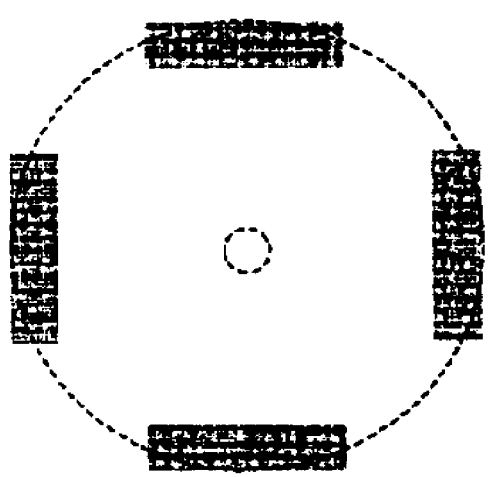
FIG. 19 is a typical view for explaining an effective light-source distribution.

Accordingly, the illumination is required to enable the diffracted beams 11–18 to enter the pupil. For example, in order for two diffracted beams 10 and 15 as an example to enter a diagonal area on the pupil plane in the projection optical system 400 shown in FIG. 16, the oblique incidence illumination is set for a dark and rectangular area "a" on the effective light-source plane in FIG. 17. The diffracted beams labeled by 10' and 15' respectively move to areas $b_1$ and $b_2$ depicted by cross lines and diagonals, and enter both ends on the pupil in the projection optical system 400. Two diffracted beams enter the pupil with the effective light source shown by one rectangle, and result in interference, forming interference infringes at a regular interval on the plate 500. Similarly, the oblique incidence illumination may be set even for two diffracted beams 10 and 17 as described for the beams 10 and 15. Four rectangular effective light source areas are combined as shown in FIG. 18, and linear interference infringes with a regular pitch in longitudinal and transverse directions cause part having strong intensity and part having weak intensity to appear two-dimensionally and periodically at intersections of overlapping light intensity on the plate 500. The effective light source at this time has, as shown in FIG. 19A, a crossed four-rectangle shape that extends in a direction orthogonal to the radial direction of the crossed pupil.

Figure 20A:
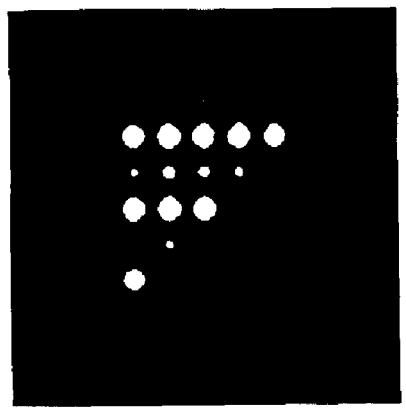
FIG. 20 is a view showing a simulation of a pattern that resolves on a pattern surface.
Figure 20A:
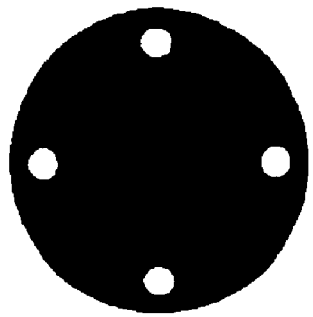
Figure 20B:
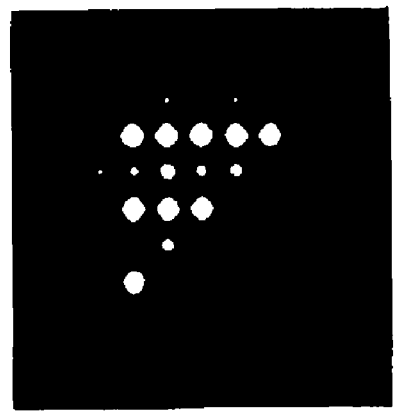
Figure 20B:
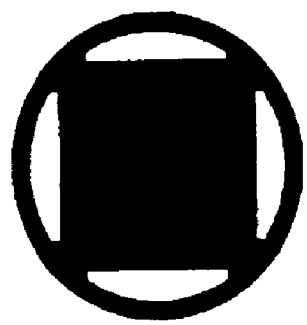

The mask 300a shown in FIG. 15 makes larger a hole diameter size of a desired contact-hole pattern than that of the auxiliary pattern, and thus the part has larger intensity than the peripheral, forming the desired contact-hole pattern on the plate 500. However, mere crossed oblique incidence illumination would create a dummy resolution pattern on the plate 500, as shown in FIGS. 20A and 20B, which is an unnecessary pattern other than the desired contact-hole pattern. Here, FIG. 20 is a view showing a simulation of a resolution pattern on the plate 500 corresponding to the right effective light source distribution.

Figure 21:
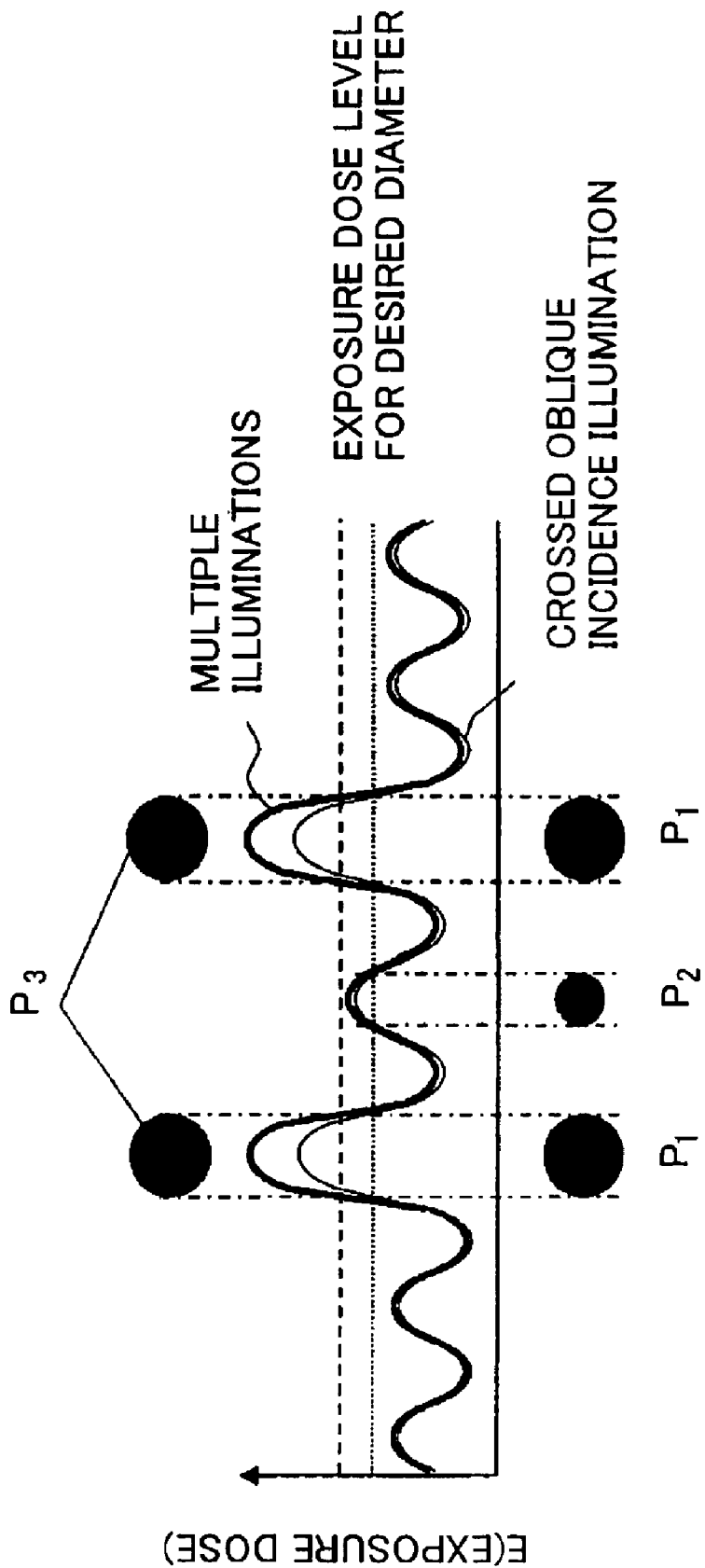
FIG. 21 is a view showing an exposure dose and an image on a pattern corresponding to the exposure dose for modified illumination.

In other words, when the exposure dose is addressed, it becomes like a ray of a thin solid line shown in FIG. 21, and the dummy resolution pattern $P_2$ occurs between desired pattern $P_1$ in the exposure dose level of the desired diameter (or a threshold of the resist). Here, FIG. 21 is a view showing an exposure dose and an image on the plate 500 corresponding to the exposure dose under crossed oblique illumination and the inventive modified illumination.

Figure 19B:
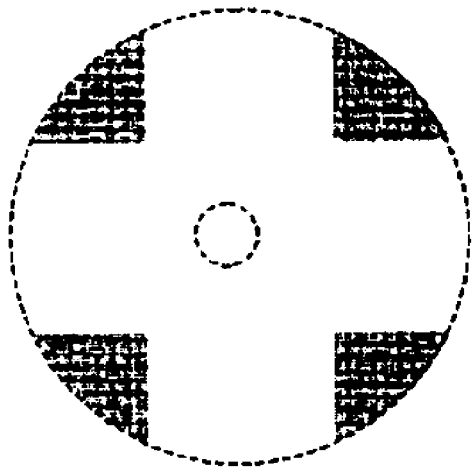
Figure 22:
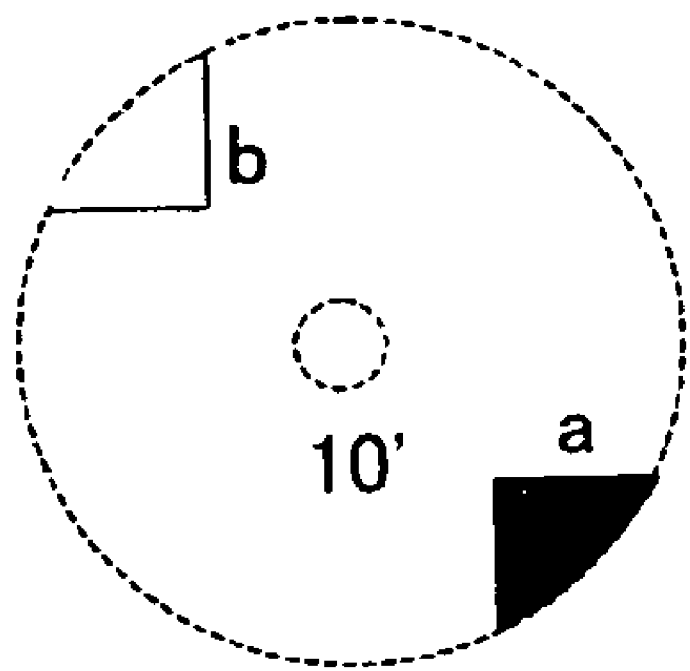
FIG. 22 shows one example of an effective light source distribution.

Accordingly, as shown in FIG. 16, except an area "c" that is defined by linearly connecting positions of two diffracted beams on the pupil plane, an effective light source distribution is added which enables only one diffracted light to enter the pupil plane. In this case, 0-th order beam is suitable for the one diffracted beam, since an oblique incidence angle may be made small. FIG. 22 shows one example of the effective light source distribution. Such illumination is available, for example, by enabling one diffracted beam 10' to enter the dark and sector area "a" in the effective light source plane. Thereby, the diffracted beam labeled by 10' moves to a bright and sector area b, and thus the diffracted light enters the pupil plane 320. There are totally four pieces corresponding to these conditions, resulting in an effective light source as shown in FIG. 19B.

Figure 19C:
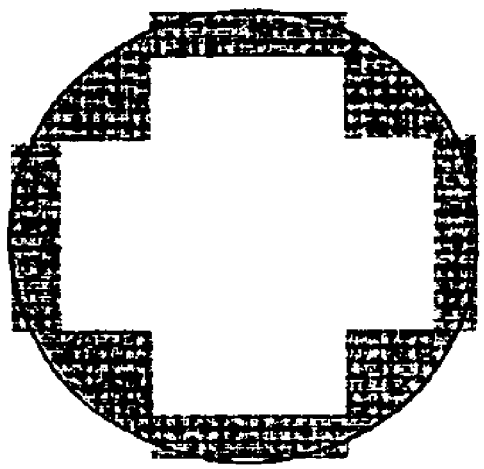
Figure 20C:
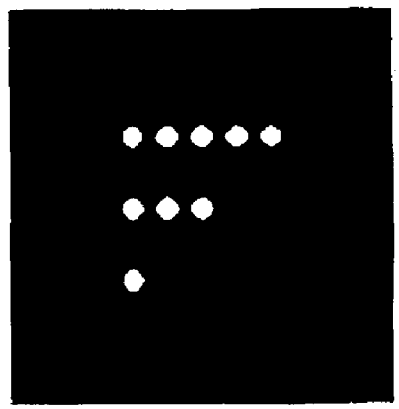
Figure 20C:
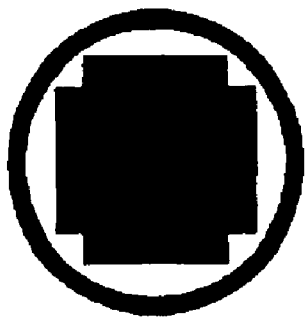

And, an addition of an effective light source distribution that enables two beams to enter, the pupil (see FIG. 19A) to an effective light source distribution that enables one beam to enter the pupil (see FIG. 19B) is modified illumination which has a crossed hollow effective light source at its central part, as shown in FIG. 19C. The modified illumination having such an effective light source distribution provides a desired pattern on the plate 500 while the dummy resolution is eliminated as shown in FIG. 20C.

In other words, the exposure dose of the plate 500 is as a ray of a wide solid line shown in FIG. 21, increases the exposure dose at part corresponding to the desired pattern on the mask, and provides a desired pattern $P_3$ without a dummy resolution pattern in the exposure dose level of the desired diameter (or a threshold of the resist).

It is thus understood that the effective light-source distribution shown in FIG. 19C improves the resolving power for the contact-hole pattern on the mask 300a shown in FIG. 15.

Among the effective light-source distribution shown in FIG. 19C, the first illumination area D corresponds to illuminating part for resolving contact holes, and the second illumination area C corresponds to illuminating part for restraining the dummy resolution caused by the illumination area D or for enhancing contrast between the desired contact-hole pattern and the auxiliary pattern (see FIG. 6).

The prism 260 shown in FIG. 5 arranges and offsets by 45° around the optical axis the concave pyramid surface 260a and the convex pyramid surface 260b, forming the effective light-source distribution shown in FIG. 6. Here, FIG. 6 is a octpole effective light-source distribution proposed by the present invention, and FIG. 7 is a schematic view showing the prism 270 for forming the effective light-source distribution shown in FIG. 6.

Use of the prism 270 for the illumination-light generating means 240 would have an effect of forming an effective light-source distribution with high illumination efficiency, while the stop member 226 does not have to shield light beyond a necessary amount near the exit surface 225b of the fly-eye lens 225.

Figure 8:
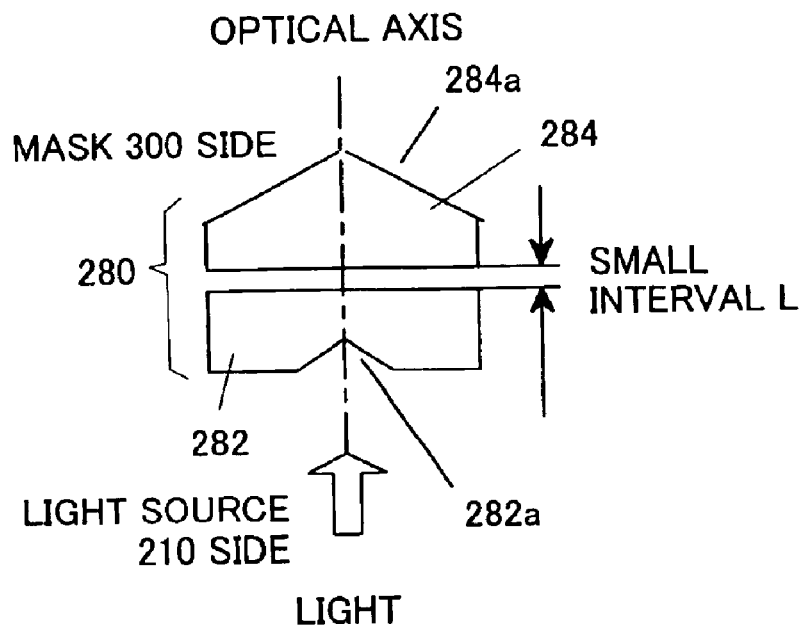
FIG. 8 is a schematic view showing one example of a pair of prisms for forming the effective light-source distribution shown in FIG. 6.
Figure 9:
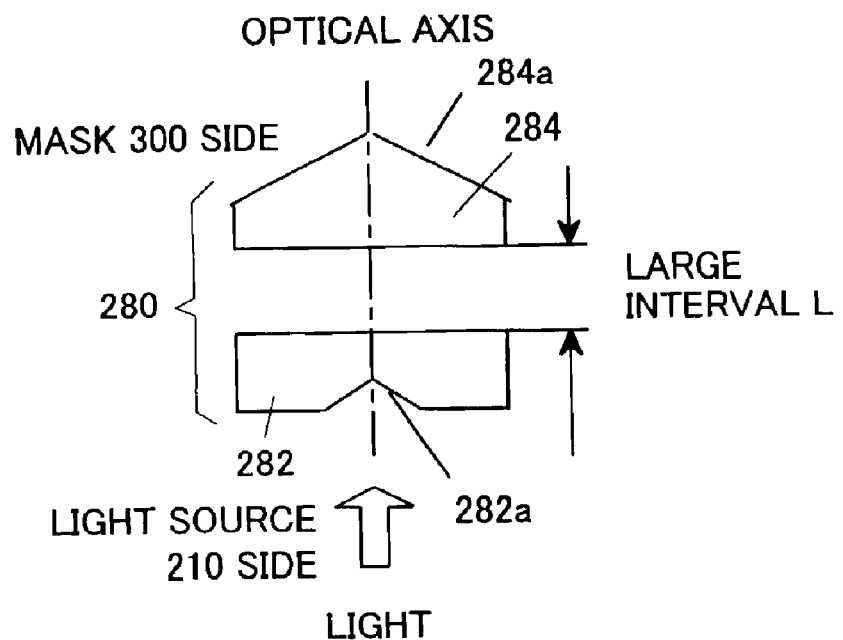
FIG. 9 is a schematic view showing the pair of prisms for forming the effective light-source distribution shown in FIG. 6.

A wider variety of effective light-source distributions may be formed by making the illumination-light generating means 240 of a pair of prisms 280, which has a prism 282 having polyhedron 282a and a prism 284 having a cone surface 284a, as shown in FIGS. 8 and 9, and by making them movable in the optical-axis direction. FIGS. 8 and 9 are schematic views showing a pair of prisms 280, for forming the effective light-source distribution shown in FIG. 6, wherein FIG. 8 shows a small interval L between the pair of prisms 280, and FIG. 9 shows a large interval L between the pair of prisms 280.

Figure 10:
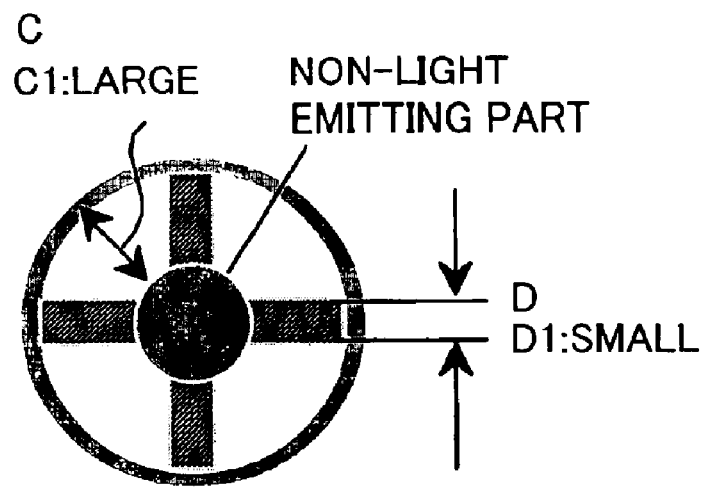
FIG. 10 is a schematic view showing a relationship between an interval L between the pair of prisms shown in FIG. 8 and a resultant effective light-source distribution.

Referring to FIG. 8, when the interval L between the pair of prism 280 is small, the length C1 in the first illumination area C becomes long and the width D1 in the second illumination area D becomes small as shown in FIG. 10. FIG. 10 is a schematic view showing the effective light-source shape formed by the pair of prisms 280 shown in FIG. 8.

Figure 11:
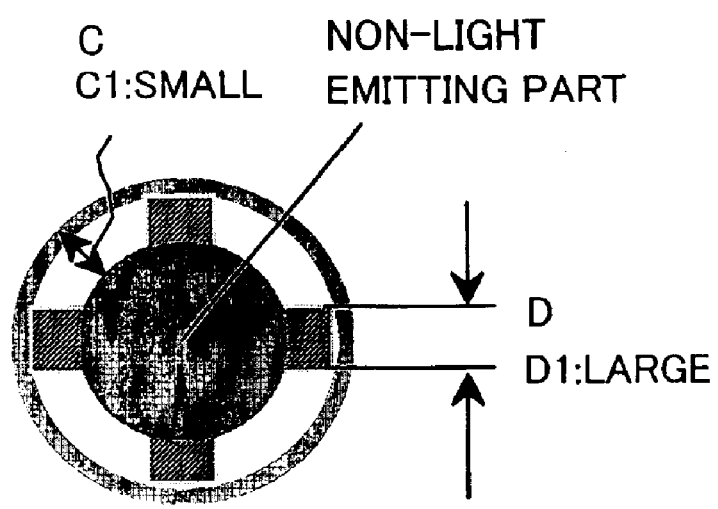
FIG. 11 is a schematic view showing a relationship between the interval L between the pair of prisms shown in FIG. 9 and a resultant effective light-source distribution.

Referring to FIG. 9, when the interval L between the pair of prism 280 is large, the length C1 in the first illumination area C becomes small and the width D1 in the second illumination area D becomes large as shown in FIG. 11. FIG. 11 is a schematic view showing the effective light-source shape formed by the pair of prisms 280 shown in FIG. 9.

Therefore, a ratio between the first and second illumination areas C and D may be adjusted according to patterns to be formed, so that the assisting effect of the auxiliary pattern becomes optimal.

A combination with the condenser zoom lens 224 in the subsequent stage would be able to adjust the size of the effective light-source distribution (or σ value) while maintaining the ratio between the first and second illumination areas C and D.

FIGS. 8 and 9 provide the prism 282 at the side of the light source section 210 with a concave polyhedron at the incidence side and a plane at the exit side, and the prism 284 at the side of the mask 300 with a plane at the incidence side and a convex cone at the exit side. Of course, the prism 282 at the side of the light source section 210 may have a plane at the incidence side and a concave polyhedron at the exit side, while the prism 284 at the side of the mask 300 may have a concave cone at the incidence side and a plane at the exit side. Nevertheless, in moving a pair of prisms of different shapes close to each other, the configuration shown in FIGS. 8 and 9 would be preferable.

The above description uses a combination between a cone and a polyhedron as a pair of prisms having surfaces of different shapes. Of course, a combination between a polyhedron and a polyhedron, e.g., a pyramid and a pyramid, would be feasible.

At least one of the prism at the light source section 210 side and the prism at the mask 300 side may be made rotatable around the optical axis to make variable the effective light-source distribution. For example, when both have a pyramid surface, the effective light source may be switched between the quadrupole illumination shown in FIG. 4 and octpole illumination shown in FIG. 6.

Figure 12:
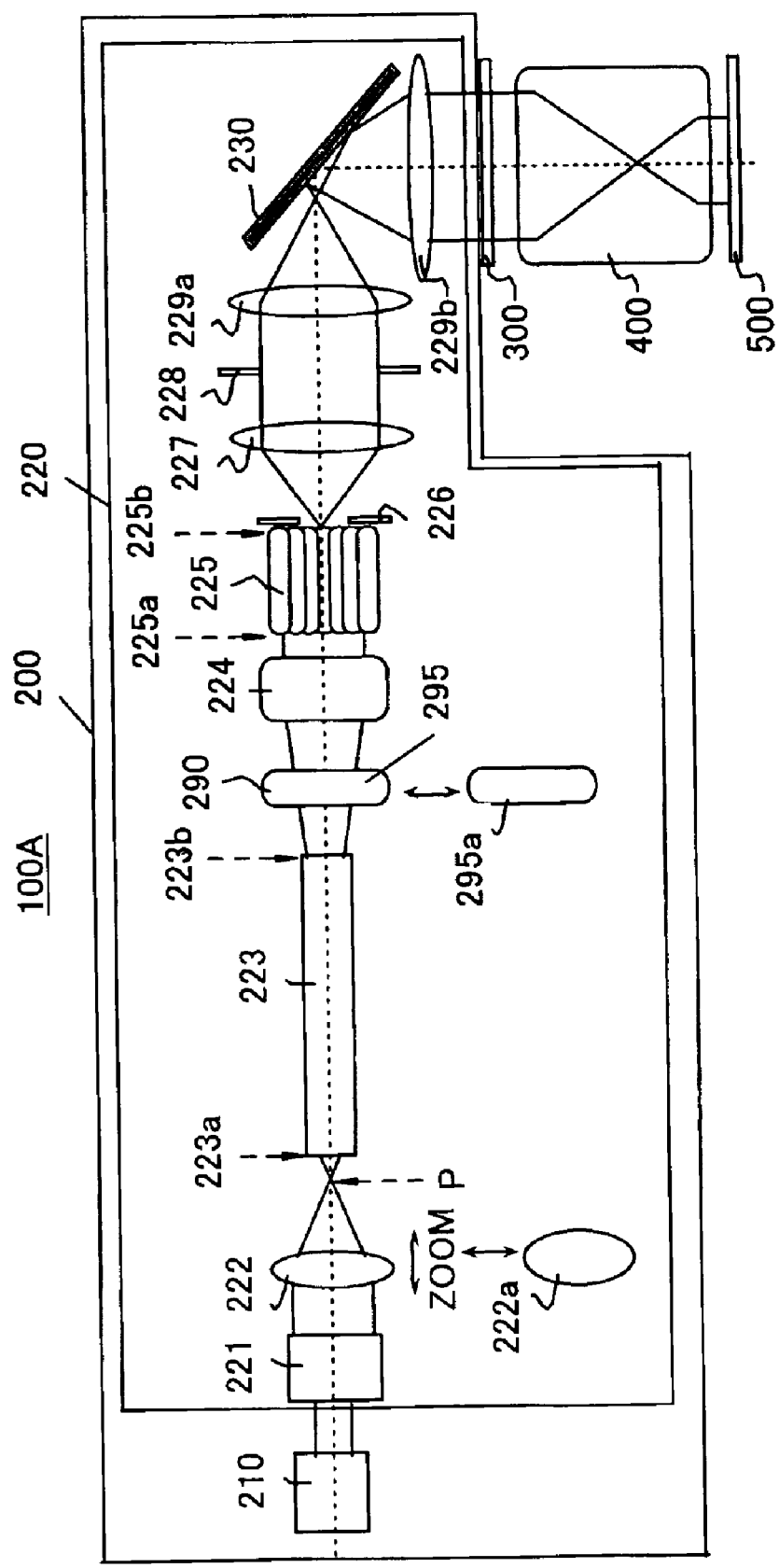
FIG. 12 is a schematic sectional view of an exposure apparatus of another embodiment according to the present invention.

Referring now to FIG. 12, a description will be given of illumination-light generating means 290 as a variation of the illumination-light generating means 240. FIG. 12 is a schematic structural diagram of a projection exposure apparatus 100A including the illumination-light generating means 290 as a variation of the illumination-light generating means 240. The illumination-light generating means 290 is different from the illumination-light generating means 240 shown in FIG. 1 in that the illumination-light generating means 290 arranges a diffraction optical element 295, such as-a binary optics ("BO"), computer generated hologram ("CGH"), etc., at a position that has an approximate Fourier conversion relationship with the incidence surface 225a of the fly-eye lens 225. The Fourier conversion relationship refers to an optical relationship between a pupil plane and an object plane (or image plane) or vice versa.

The diffraction optical element 295 is designed to form a desired distribution on a Fourier conversion surface in response to a parallel ray. The diffraction optical element is designed and manufactured so as to form the effective light-source distribution shown in FIG. 6. The design and manufacture of the diffraction optical element may use any method known in the art, as disclosed in Japanese Patent Publication No. 11-54426, corresponding to U.S. Pat. No. 6,259,512, and Introduction to Diffraction Optical Elements (Supervision of Applied Physics Academy and Publisher of Optonics Inc.), and thus a detailed description thereof will be omitted.

When the light incident upon the diffraction optical element 295 is not a parallel ray but angled, an image formed on the Fourier conversion surface blurs. When a condenser optical system 222a makes a variable NA defined by the condenser optical system 222, the width defined by the first and second illumination areas C and D shown in FIG. 6 becomes variable. The condenser optical system 222a may use a turret to switch optical systems with different NAs, or a zoom system that has a variable NA.

The illumination-light generating means 290 may use switching means like a turret to switch plural optical elements 295a according to desired patterns formed on the mask 300.

While the above embodiments arrange the illumination-light generating means 240 and 290 between the optical pipe 223 and fly-eye lens 225, the second fly-eye lens may be used instead of the optical pipe 223. In that case, the illumination-light forming means 240 and 290 are arranged between the second fly-eye lens and the fly-eye lens 225. Preferably, the illumination-light generating means 240 and 290 are arranged at a position that has an optical Fourier conversion relationship with the incident surface 225a of the fly-eye lens 225.

Turning back to FIG. 1 again, the mask 300 is made, for example, of quartz, which forms a circuit pattern or an image to be transferred, and is supported and driven by a mask stage (not shown). Diffracted light through the mask 300 is projected onto the plate 500 through the projection optical system 400. The mask 300 and plate 500 are arranged in a conjugate relationship. Since the exposure apparatus 100 according this embodiment is a scanner, it transfers a mask pattern onto the plate 500 by scanning the mask 300 and plate 500.

The projection optical system 400 forms an image onto an image plane, e.g., an object to be exposed or the plate 500 using light from an object plane, i.e., the mask 300. The projection optical system 400 may use an optical system solely composed of a plurality of lens elements, a catadioptric optical system comprised of a plurality of lens elements and at least one concave mirror, an optical system comprised of a plurality of lens elements and at least one diffractive optical element such as a kinoform, and a cataoptric optical system including only mirrors, and so on. Any necessary correction of chromatic aberration may use a plurality of lens units made from glass materials having different dispersion values (Abbe values), or arrange a diffractive optical element such that it disperses in a direction opposite to that of the lens unit.

The plate 500 is a wafer in the instant embodiment, but it may include a liquid crystal plate and a wide range of other objects to be exposed. Photoresist is applied onto the plate 500. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photo resist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The plate 500 is supported by the plate stage (not shown). The plate stage may use any structure known in the art, and thus a detailed description of its structure and operations is omitted. For example, the plate stage uses a linear motor to move the plate 500 in X-Y directions. The mask 300 and plate 400 are, for example, scanned synchronously, and the positions of the mask stage and plate stage (not shown) are monitored, for example, by a laser interferometer and the like, so that both are driven at a constant speed ratio. The plate stage is installed on a stage barrel stool supported on the floor and the like, for example, via a dumper, while the mask stage and the projection optical system 400 are installed on a stage barrel stool (not shown) supported by the base frame placed on the floor, for example, via a dumper.

In exposure, light emitted from the light source section 210 illuminates the mask 300 through the illumination optical system 220. The light that has passed and indicates the mask pattern forms an image on the plate 500 through the projection optical system 400.

The illumination optical system 200 used for the exposure apparatus 100 illuminates the mask 300 with an optimal illumination condition according to the desired pattern formed on the mask 300, economically providing devices (such as semiconductor devices, LCD devices, image pick-up devices (such as CCDs), thin film magnetic heads, and the like) with high resolution, throughput and economical efficiency.

Figure 13:
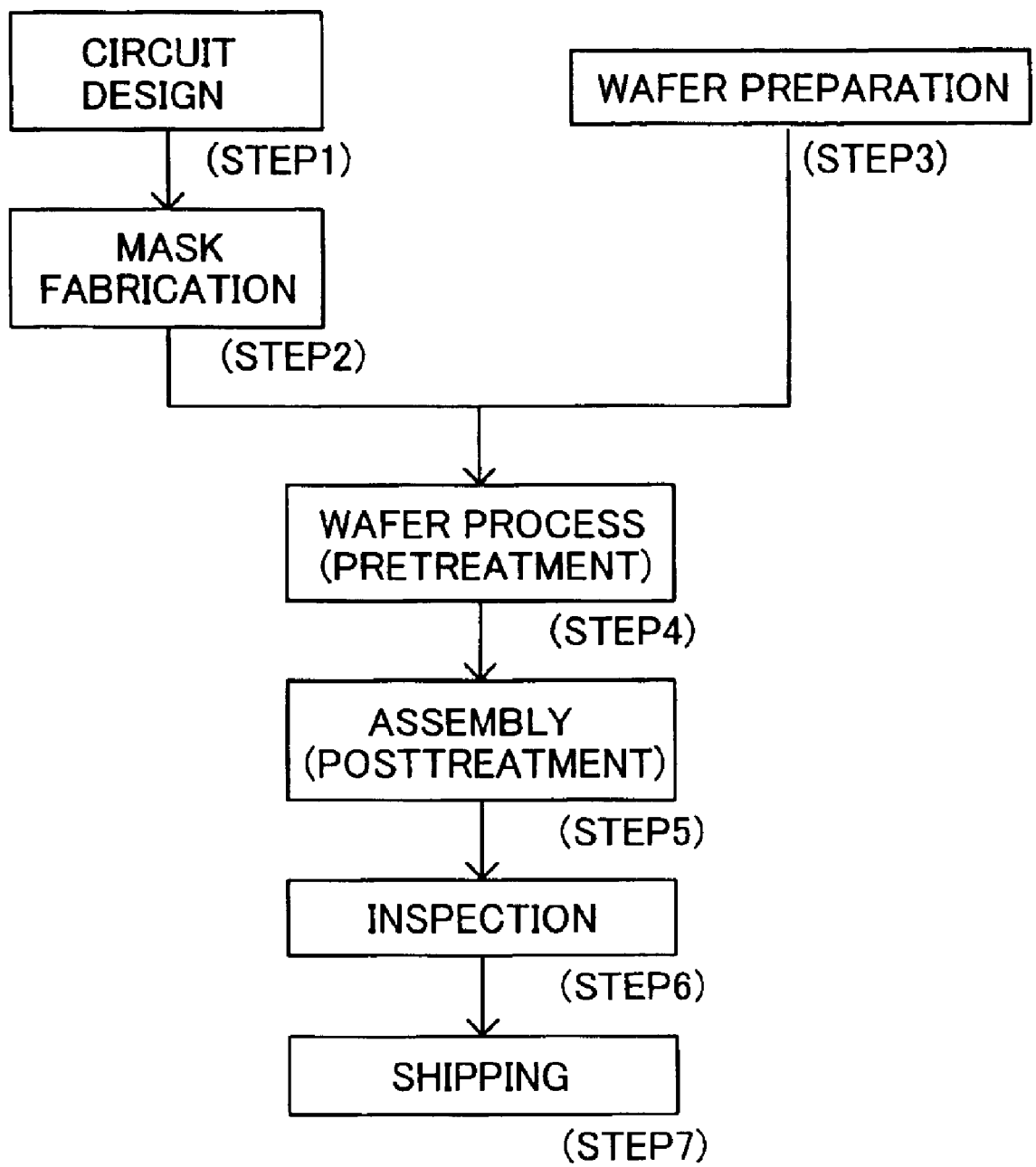
FIG. 13 is a flowchart for explaining a device fabricating method that includes the exposure steps of the present invention.
Figure 14:
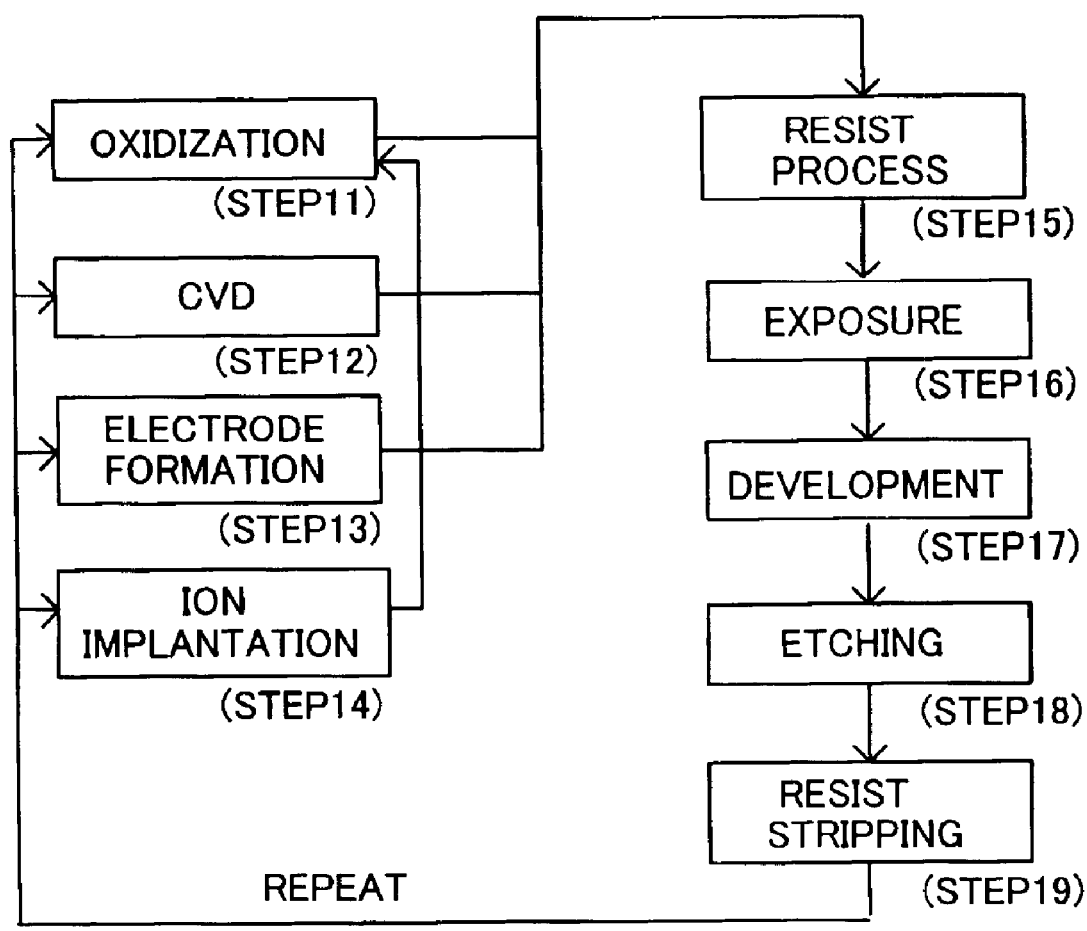
FIG. 14 is a flowchart for Step 4 shown in FIG. 13.

Referring now to FIGS. 12 and 13, a description will be given of an embodiment of a device fabricating method using the above exposure apparatus 100. FIG. 12 is a flowchart for explaining a fabrication of devices (i.e., semiconductor chips such as IC and LSI, LCDs, CCDS, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 13 is a detailed flowchart of the wafer process in Step 4 shown in FIG. 7. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one.

Further, the present invention is not limited to these preferred embodiments, and various variations and modifications may be made without departing from the scope of the present invention.

The inventive illumination optical system thus provides a desired effective light source according to sizes and arrangements of mask patterns and changes of processes.

What is claimed is:

1. An illumination optical system for illuminating a reticle using light from a light source, said illumination optical system comprising
   an illumination-light generating mechanism for generating a light amount distribution on a plane that has a substantially Fourier conversion relationship with the reticle while making variable a ratio of a light amount between a first area and a second area different from the first area, the first and second areas being adjacent to the peripheral edge of the plane, wherein light from the first area substantially illuminates the reticle to resolve a desired pattern on the reticle, and light from the second area substantially illuminates the reticle to restrain an auxiliary pattern on the reticle from resolving.

2. An illumination optical system according to claim 1, wherein the illumination-light generating mechanism includes a prism or diffraction optical element.

3. An illumination optical system for illuminating an object surface using light from a light source, said illumination optical system comprising
   an illumination-light generating mechanism for generating a light amount distribution on a plane that has a substantially-Fourier conversion relationship with the object surface, wherein said illumination-light generating mechanism includes:
      a first light transmission element that is arranged at a side of the light source and forms a first light division part for dividing the light on a surface of the first light transmission element; and
      a second light transmission element that is arranged at a side of the object surface and forms a second light division part for dividing the light on a surface of the second light transmission element, and wherein the first and second light division parts have non-parallel sectional shapes that include an optical axis.

4. An illumination optical system according to claim 3, wherein the first and second light transmission elements move in an optical-axis direction relative to each other, wherein one of the first and second light transmission elements has a polyhedral incidence or exit end, and the other of the first and second light transmission elements has a cone incidence or exit surface.

5. An illumination optical system according to claim 4, wherein the polyhedral end of the first and/or second light transmission elements has a pyramid shape.

6. An illumination optical system according to claim 3, wherein the first light transmission element has a concave polyhedral or cone incidence end and a plane exit end, while the second light transmission element has a convex plane incidence end and a polyhedral or cone exit end.

7. An illumination optical system according to claim 3, wherein the first light transmission element has a convex plane incidence end and a polyhedral or cone exit end, while the second light transmission element has a concave polyhedral or cone incidence end and a plane exit end.

8. An illumination optical system for illuminating an object surface using light from a light source, said illumination optical system comprising a prism for generating a light amount distribution on a plane that has a substantially Fourier conversion relationship with the object surface, wherein said prism having an incidence surface has a polygonal pyramid shape, and a cone exit surface.

9. An illumination optical system for illuminating an object surface using light from a light source, said illumination optical system comprising
an illumination-light generating mechanism for generating a light amount distribution on a plane that has a substantially Fourier conversion relationship with the object surface, wherein said illumination-light generating mechanism includes:
a first prism that receives the light from the light source; and
a second prism that receives light from the first prism, and wherein one of the first and second prisms has a polyhedral incidence or exit end, and the other of the first and second prisms has a cone incidence or exit surface.

10. An illumination optical system according to claim 9, wherein at least one of the first and second prisms are adapted to be movable in an optical-axis direction.

11. An illumination optical system according to claim 9, wherein at least one of the first and second prisms are rotatable around an optical axis.

12. An exposure method comprising the step of illuminating a reticle using an illumination optical system with light from a light source,
wherein the illumination optical system includes an illumination-light generating mechanism for generating a light amount distribution on a plane that has a substantially Fourier conversion relationship with the reticle while making variable a ratio of a light amount between a first area and a second area different from the first area, the first and second areas being adjacent to the peripheral edge of the plane, and
wherein light from the first area substantially contributes to a resolution of a desired pattern on the reticle, and light from the second area substantially contributes to a restraint of an auxiliary pattern from resolving.

13. An exposure apparatus comprising:
an illumination optical system that includes an illumination-light generating mechanism for generating a light amount distribution on a plane that has a substantially Fourier conversion relationship with a reticle while making variable a ratio of a light amount between a first area and a second area different from the first area, the first and second areas being adjacent to the peripheral edge of the plane; and
a projection optical system for projecting light from the reticle onto an object to be exposed,
wherein light from the first area substantially illuminates the reticle to resolve a desired pattern on the reticle, and light form the second area substantially illuminates the reticle to restrain an auxiliary pattern on the reticle from resolving.

14. An exposure apparatus comprising:
an illumination optical system that includes an illumination-light generating mechanism for generating a light amount distribution on a plane that has a substantially Fourier conversion relationship with the object surface, wherein said illumination-light generating mechanism includes a first light transmission element that is arranged at a side of the light source and forms a first light division part for dividing the light on a surface of the first light transmission element, and a second light transmission element that is arranged at a side of the object surface and forms a second light division part for dividing the light on a surface of the second light transmission element, and wherein the first and second light division parts have non-parallel sectional shapes that include an optical axis; and
a projection optical system for projecting light from the reticle onto an object to be exposed.

15. An exposure apparatus comprising:
an illumination optical system that includes a prism for generating a light amount distribution on a plane that has a substantially Fourier conversion relationship with the object surface, wherein said prism having an incidence surface having a polygonal pyramid shape, and a cone exit surface; and
a projection optical system for projecting light from the reticle onto an object to be exposed.

16. An exposure apparatus comprising:
an illumination optical system that includes an illumination-light generating mechanism for generating a light amount distribution on a plane that has a substantially Fourier conversion relationship with the object surface, wherein said illumination-light generating mechanism includes a first prism that receives the light from the light source, and a second prism that receives light from the first prism, and wherein one of the first and second prisms has a polyhedral incidence or exit end, and the other of the first and second prisms has a cone incidence or exit surface; and
a projection optical system for projecting light from the reticle onto an object to be exposed.

17. A device fabricating method comprising the steps of:
exposing an object using an exposure apparatus; and
performing a predetermined process for the object that has been exposed, wherein the exposure apparatus includes:
an illumination optical system that includes an illumination-light generating mechanism for generating a light amount distribution on a plane that has a substantially Fourier conversion relationship with the reticle while making variable a ratio of a light amount between a first area and a second area different from the first area, the first and second areas being on adjacent to the peripheral edge of the plane; and
a projection optical system for projecting light from the reticle onto an object to be exposed
wherein light from the first area substantially illuminates the reticle to resolve a desired pattern on the reticle, and light from the second area substantially illuminates the reticle to restrain an auxiliary pattern on the reticle from resolving.

18. A device fabricating method comprising the steps of:
exposing an object using an exposure apparatus; and
performing a predetermined process for the object that has been exposed, wherein the exposure apparatus includes:
an illumination optical system that includes an illumination-light generating mechanism for generating a light amount distribution on a plane that has a substantially Fourier conversion relationship with the object surface, wherein said illumination-light generating mechanism includes a first light transmission element that is arranged at a side of the light source and forms a first light division part for dividing the light on a surface of the first light transmission element, and a second light transmission element that is arranged at a side of the object surface and forms a second light division part for dividing the light on a surface of the second light transmission element, and wherein the first and second light division parts have non-parallel sectional shapes that include an optical axis; and a projection optical system for projecting light from the reticle onto an object to be exposed.

19. A device fabricating method comprising the steps of:

exposing an object using an exposure apparatus; and performing a predetermined process for the object that has been exposed, wherein the exposure apparatus includes:

an illumination optical system that includes a prism for generating a light amount distribution on a plane that has a substantially Fourier conversion relationship with the object surface, wherein said prism having an incidence surface having a polygonal pyramid shape, and a cone exit surface; and a projection optical system for projecting light from the reticle-onto an object to be exposed.

20. A device fabricating method comprising the steps of:

exposing an object using an exposure apparatus; and performing a predetermined process for the object that has been exposed, wherein the exposure apparatus includes:

an illumination optical system that includes an illumination-light generating mechanism for generating a light amount distribution on a plane that has a substantially Fourier conversion relationship with the object surface, wherein said illumination-light generating mechanism includes a first prism that receives the light from the light source, and a second prism that receives light from the first prism, and wherein one of the first and second prisms has polyhedral incidence or exit ends, and the other of the first and second prisms has cone incidence or exit surfaces; and a projection optical system for projecting light from the reticle onto an object to be exposed.

* * * * *